(12) United States Patent
Yoon et al.

(10) Patent No.: US 6,841,416 B2
(45) Date of Patent: Jan. 11, 2005

(54) CHIP SCALE PACKAGE AND METHOD OF FABRICATING THE SAME

(75) Inventors: Joon Ho Yoon, Seoul (KR); Yong Chil Choi, Suwon (KR); Suk Su Bae, Changwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 26 days.

(21) Appl. No.: 10/329,810

(22) Filed: Dec. 27, 2002

(65) Prior Publication Data

US 2003/0176015 A1 Sep. 18, 2003

(30) Foreign Application Priority Data

Mar. 18, 2002 (KR) ........................................ 2002-14571

(51) Int. Cl.[7] .............................................. H01L 21/50
(52) U.S. Cl. ........................ 438/106; 438/123; 438/119
(58) Field of Search ................................ 438/106, 123, 438/119, 124; 257/666, 690

(56) References Cited

U.S. PATENT DOCUMENTS

| | | | |
|---|---|---|---|
| 5,994,167 A | | 11/1999 | Tai et al. |
| 6,074,894 A | * | 6/2000 | Suetsugu et al. ............ 438/106 |
| 6,177,719 B1 | * | 1/2001 | Huang et al. ................ 257/666 |
| 6,383,838 B2 | * | 5/2002 | Ryu ........................... 438/106 |

* cited by examiner

Primary Examiner—Caridad Everhart
(74) Attorney, Agent, or Firm—Lowe Hauptman Gilman & Berner, LLP (57) ABSTRACT

A method of fabricating a chip scale package includes: preparing a wafer including a plurality of chips; forming an insulating layer on the upper surface of the wafer except in areas of two upper terminals of each chip; forming an upper conductive layer on the insulating layer so as to be connected to the upper terminals of the chips; forming a lower conductive layer on the lower surface of the wafer so as to be connected to a lower terminals of each chip; first dicing the wafer so that one side of the chip scale package is formed; forming electrode surfaces on side surfaces of the upper and the lower conductive layers which are defined by the side of the chip scale package formed in the first dicing step; dividing the upper conductive layer of each chip into two areas each connected to one of the two upper terminals; and second dicing the wafer into package units.

12 Claims, 11 Drawing Sheets

PRIOR ART

FIG. 1

PRIOR ART

CHIP SCALE PACKAGE AND METHOD OF FABRICATING THE SAME

BACKGROUND OF THE INVENTION

1. Field of the Invention

The present invention relates to a chip scale package, and more particularly to a chip scale package, which comprises a chip type device, i.e., a transistor having two terminals on one surface and one terminal on the other surface, and a method of fabricating the chip scale package.

2. Description of the Related Art

Generally, semiconductor devices such as transistors are packaged and these packaged devices are then mounted on a printed circuit board. Structurally, this package easily connects terminals of the semiconductor device to corresponding signal patterns of the printed circuit board and serves to protect the semiconductor device from external stresses, thereby improving reliability of the package.

In order to satisfy recent trends of miniaturization of semiconductor products, the semiconductor chip packages also have been miniaturized. Therefore, a chip scale package (also, referred to as a "Chip Size Package") has been introduced.

Figure 1:
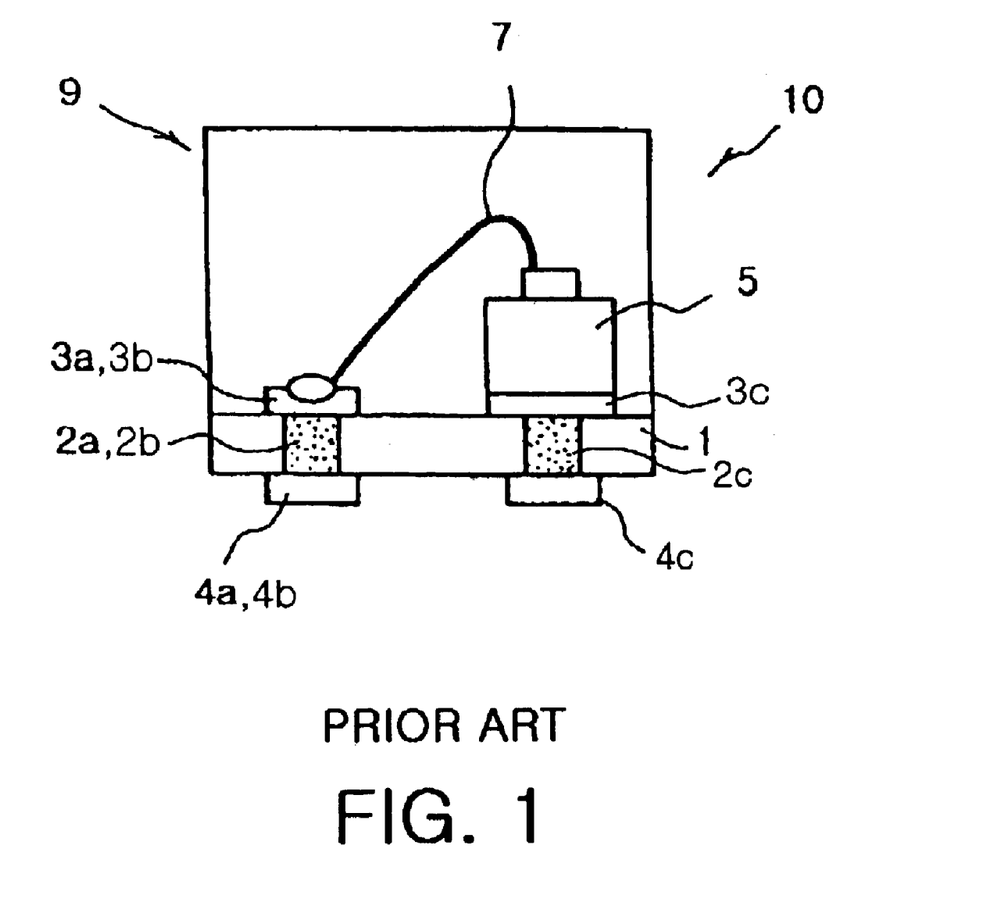
FIG. 1 is a schematic cross-sectional view of a conventional chip scale package.

FIG. 1 is a schematic cross-sectional view of a conventional chip scale package. The structure of the chip scale package 10 of FIG. 1 employs a ceramic substrate 1 and is a transistor package with three terminals.

With reference to FIG. 1, three via holes, i.e., a first via hole 2a, a second via hole 2b, and a third via hole 2c, are formed on the ceramic substrate 1. The first, the second, and the third via holes 2a, 2b, and 2c are filled with a conductive material so as to electrically connect the upper surface of the substrate 1 to the lower surface of the substrate 1. Then, a first, a second, and a third upper conductive lands 3a, 3b, and 3c are formed on the upper surfaces of the first, the second, and the third via holes 2a, 2b, and 2c, respectively. A first, a second, and a third lower conductive lands 4a, 4b, and 4c are formed on the lower surfaces of the first, the second, and the third via holes 2a, 2b, and 2c, respectively. The third upper conductive land 3c is directly connected to a terminal formed on the lower surface of the transistor 5, i.e., a mounting surface of the transistor 5 on a printed circuit board, and the first and the second upper conductive lands 3a and 3b are connected to other terminals formed on the upper surface of the transistor 5 by a wire 7. A molding part 9 using a conventional resin is formed on the upper surface of the ceramic substrate 1 including the transistor 5 in order to protect the transistor 5 from the external stresses. Thereby, the manufacture of the package 10 is completed.

Figure 2:
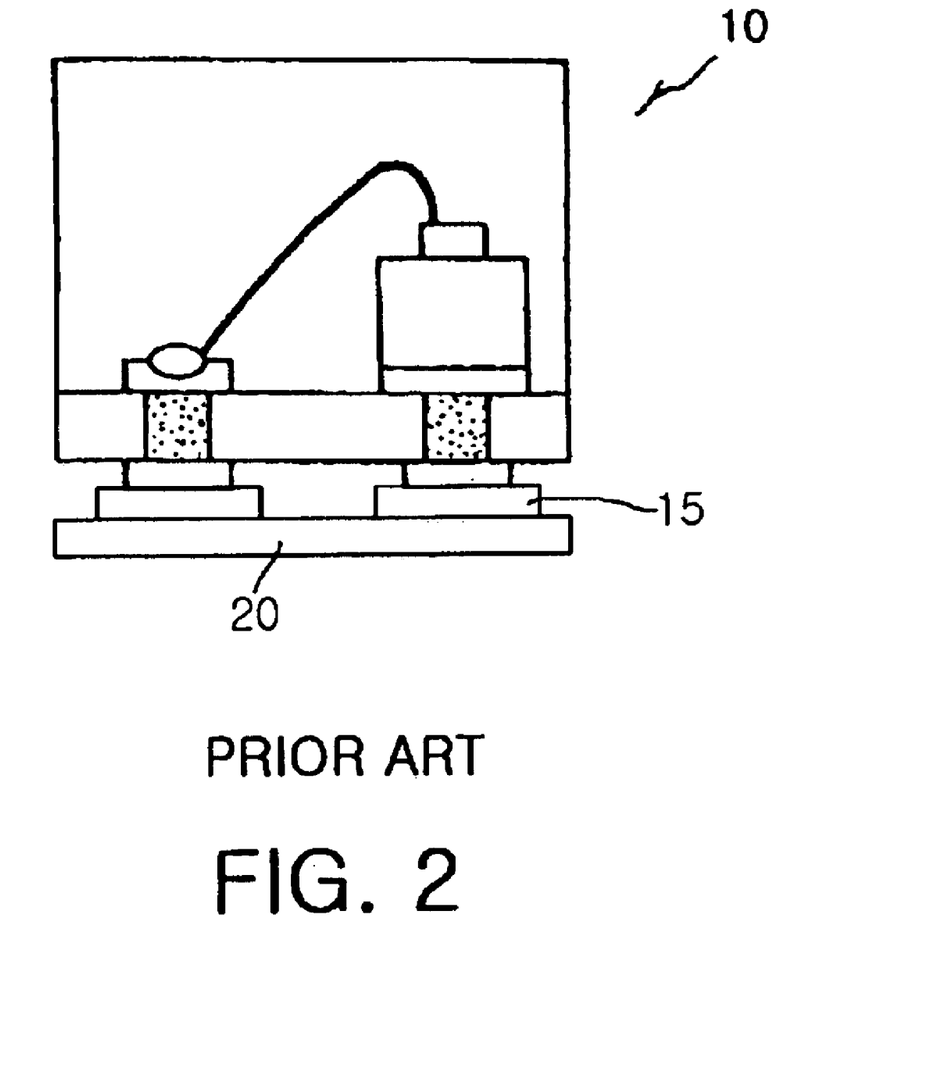
FIG. 2 is a cross-sectional view of a conventional chip scale package assembly, in which the chip scale package is mounted on a printed circuit board.

FIG. 2 is a cross-sectional view of a conventional chip scale package assembly, in which the chip scale package is mounted on the printed circuit board.

As shown in FIG. 2, the manufactured transistor package 10 is mounted on the printed circuit board 20 by a reflow soldering. That is, the transistor package 10 is mounted on the printed circuit board 20 by arranging the lower conductive lands 4a, 4b, and 4c of the package 10 on the corresponding signal patterns of the printed circuit board 20 and by then connecting the lower conductive lands 4a, 4b, and 4c to the signal patterns of the printed circuit board 20 with a solder 15.

As shown in FIGS. 1 and 2, since the transistor usually has terminals on each of its two opposite surfaces, these terminals must be interconnected by wires. However, these wires require a large space on the upper surface of the chip, thereby increasing the overall height of the package. Further, since at least three via holes, corresponding to the number of terminals of the transistor, must be formed on the ceramic substrate, an area as large as the total diameters of the via holes is further required. Moreover, in order not to connect the conductive lands formed on the upper and the lower surfaces of the via holes to each other, the conductive lands must be spaced from each other by a minimum interval. Therefore, the substrate has a large size so as to satisfy the aforementioned conditions, and the size of the substrate imposes a limit in miniaturizing the package.

Further, the ceramic substrate, which is employed by the above-described package, is high-priced, thereby increasing the production cost of the package. Moreover, the conventional fabrication process of the package requires a wire-bonding step and a molding step as well as a die-bonding step, thereby being very complicated.

Accordingly, a packaging technique, which can minimize the size of the package and simplify its fabricating process, has been demanded.

SUMMARY OF THE INVENTION

Therefore, the present invention has been made in view of the above problems, and it is an object of the present invention to provide a chip scale package, which is miniaturized and more simply fabricated, by forming an insulating layer on the upper surface of a chip except for two terminal areas, by forming an upper and a lower conductive layers on the upper surface of the insulating layer and the lower surface of the chip so as to be connected to each of terminals, and by forming electrode surfaces on the same side surfaces of the upper and the lower conductive layers so as to be connected to corresponding connection pads of a printed circuit board, thereby improving the reliability of the package.

It is another object of the present invention to provide a chip package assembly with an innovative mounting method according to the structure of the chip scale package.

It is a yet another object of the present invention to provide a method of fabricating the chip scale package.

In accordance with one aspect of the present invention, the above and other objects can be accomplished by the provision of a chip scale package comprising a chip having a first surface provided with two first terminals and a second surface provided with a second terminal, the second surface being opposite to the first surface, an insulating layer formed on the first surface of the chip except for areas for two terminals, a first and a second conductive layers formed on insulating layer and spaced from each other by a designated distance so as to be connected to each of two terminals, a third conductive layer formed on the second surface of the chip so as to be connected to the terminal of the second surface of the chip, and electrode surfaces formed on each of designated side surfaces of the first, the second, and the third conductive layers.

In accordance with another aspect of the present invention, there is provided a chip scale package assembly comprising a chip scale package and a printed circuit board. The chip scale package comprises a chip having a first surface provided with two first terminals and a second surface provided with a second terminal, the second surface being opposite to the first surface, an insulating layer formed on the first surface of the chip except for areas for two terminals, a first and a second conductive layers formed on insulating layer and spaced from each other by a designated distance so as to be connected to each of two terminals, a third conductive layer formed on the second surface of the chip so as to be connected to the terminal of the second surface of the chip, and electrode surfaces formed on each of designated side surfaces of the first, the second, and the third conductive layers. The printed circuit board comprises at least three connection pads, and circuit patterns connected to the connection pads. Herein, the chip scale package is mounted on the printed circuit board so that the electrode surfaces of the chip are attached to each of the connection pads of the printed circuit board.

In accordance with yet another aspect of the present invention, there is provided a method of fabricating a chip scale package, comprising the steps of preparing a wafer including a plurality of chips, the chip including two terminals on its upper surface and a terminal on its lower surface, respectively, forming an insulating layer on the upper surface of the wafer except for areas for two terminals, forming an upper conductive layer on insulating layer so as to be connected to each of two terminals of the upper surface of the chip, forming a lower conductive layer on the lower surface of the chip so as to be connected to the terminal of the lower surface of the chip, first-dicing the wafer into so that one side surface of the chip scale package is formed, forming electrode surfaces on side surfaces of the upper and the lower conductive layers, the side surfaces formed on the side surface of the chip scale package obtained by first-dicing the wafer, dividing the upper conductive layer formed on the insulating layer into two areas connected to each of two terminals, and second-dicing the wafer into package units.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 3A:
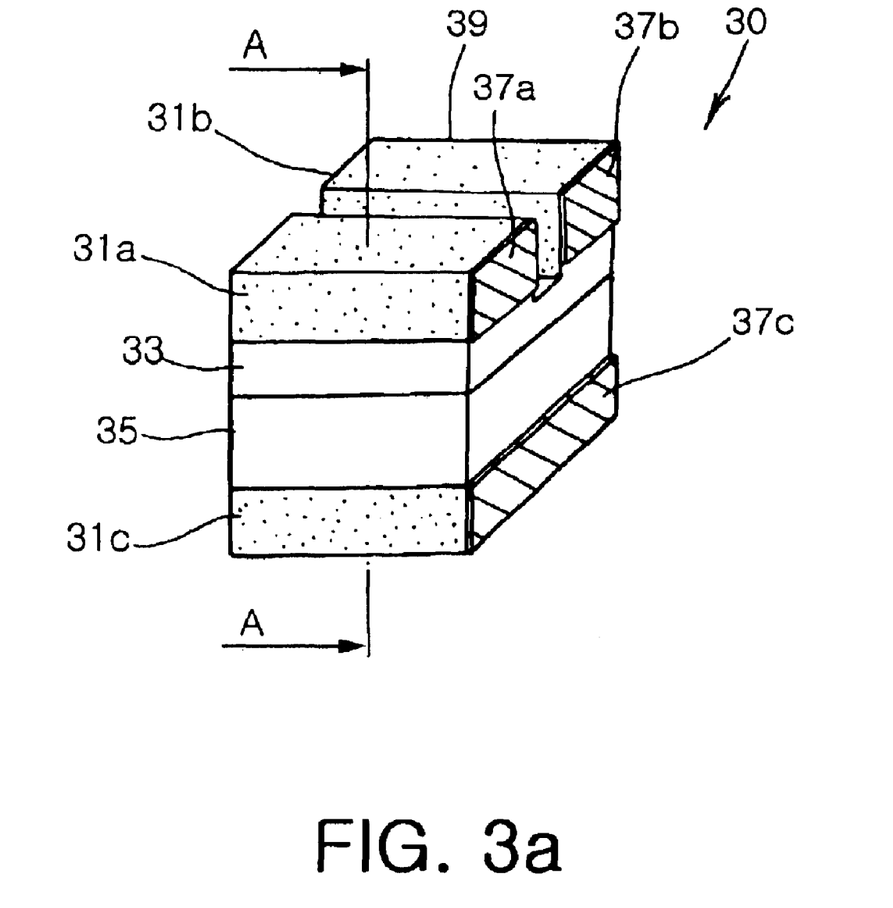
FIGS. 3a and 3b are a perspective view and a cross-sectional view of a chip scale package in accordance with a preferred embodiment of the present invention.
Figure 3B:
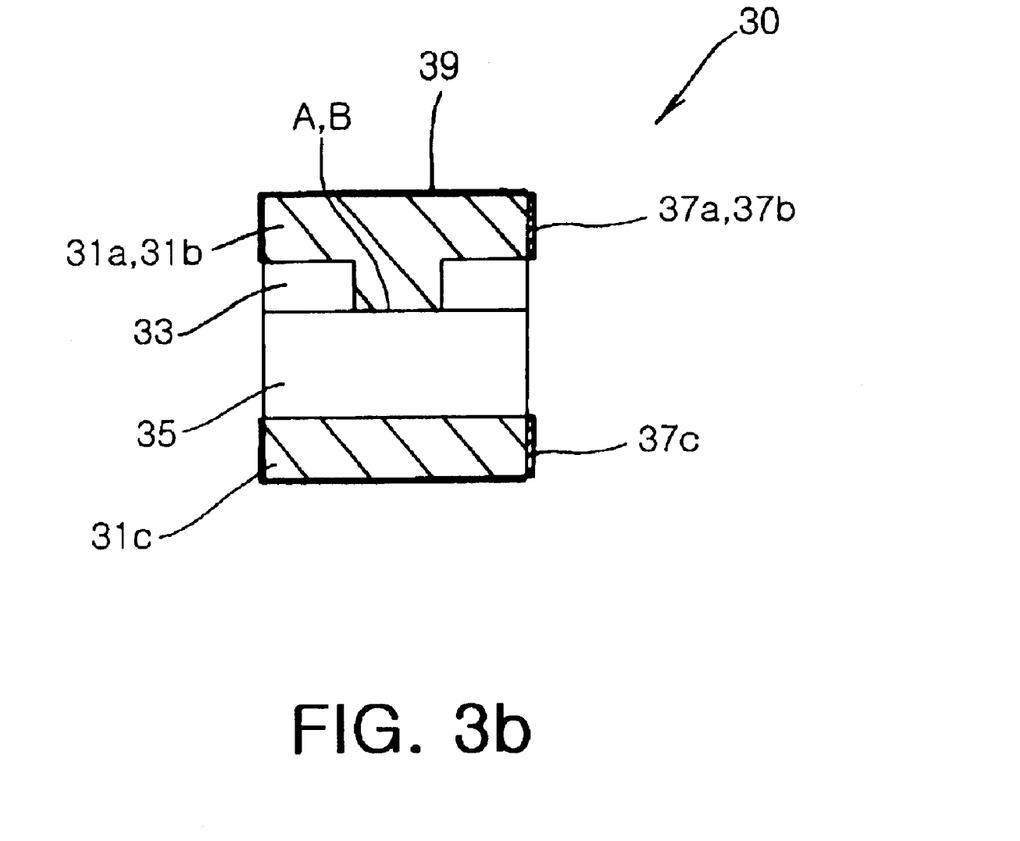

FIGS. 3a and 3b are a perspective view and a cross-sectional view of a chip scale package in accordance with a preferred embodiment of the present invention.

With reference to FIG. 3a, a chip scale package 30 comprises a chip 35, an insulating layer 33 formed on the chip 35, conductive layers 31a, 31b, and 31c formed on the upper surface of the insulating layer 33 and the lower surface of the chip 35, and electrode surfaces 37a, 37b, and 37c formed on the sides surfaces of the conductive layers 31a, 31b, and 31c. Herein, the sides surfaces of the conductive layers 31a, 31b, and 31c having the electrode surfaces 37a, 37b, and 37c are on the same side surface of the chip 35. Not shown in FIG. 3a, two terminals are formed on the upper surface of the chip 35, and one terminal is formed on the lower surface of the chip 35. For example, the aforementioned chip 35 is a transistor.

With reference to FIG. 3b, the insulating layer 33 is formed on the upper surface of the chip 35 except for areas for two terminals A and B. The first and the second conductive layers 31a and 31b are formed on the insulating layer 33. The first and the second conductive layers 31a and 31b are connected to the terminals A and B formed on the upper surface of the chip 35, respectively. The first and the second conductive layers 31a and 31b are spaced from each other by a designated distance. Further, the third conductive layer 31c is formed on the lower surface of the chip 35, and electrically connected to a terminal (not shown) formed on the lower surface of the chip 35.

Preferably, the first, the second, and the third conductive layers 31a, 31b, and 31c are metal layers made of copper (Cu), but are not limited thereto. Further, the thickness of the first, the second, and the third conductive layers 31a, 31b, and 31c varies according to the kinds of a printed circuit board. That is, the thickness of the first, the second, and, the third conductive layers 31a, 31b, and 31c is determined by an interval between connection pads of a printed circuit board. Since the electrode surfaces 37a, 37b, and 37c formed on the side surfaces of the conductive layers 31a, 31b, and 31c are located on the corresponding connection pads of the printed circuit board, the conductive layers 31a, 31b, and 31c require sufficient thickness.

The first, the second, and the third conductive layers 31a, 31b, and 31c can be formed at a predetermined depth by a conventional plating method. However, the formation of the first, the second, and the third conductive layers 31a, 31b, and 31c using the plating method requires a long time and a higher production cost. Therefore, preferably, a plating layer is first formed by an electroplating. Then, at least one copper layer is stacked on the plating layer, thereby easily forming the conductive layers with the desired depth.

Further, the first and the second electrode surface 37a and 37b are formed one side surfaces of the first and the second conductive layers 31a and 31b, respectively. The third electrode surface 37c is formed on a side surface of the third conductive layer 31c. The side surfaces of the first, the second, and the third conductive layers 31a, 31b, and 31c having the first, the second, and the third electrode surfaces 37a, 37b, and 37c are on the same side surface of the chip 35. The first, the second, and the third electrode surfaces 37a, 37b, and 37c are electrically and mechanically connected to the corresponding connection pads of the printed circuit board. Therefore, preferably, the first, the second, and the third electrode surfaces 37a, 37b, 37c are metal layers including gold (Au) with an excellent electric conductivity as so to subsequently perform the soldering.

In the aforementioned chip scale package 30 as shown in FIG. 3b, the insulating layer 33 is formed on the upper surface of the chip 35 except for the areas including two terminals A and B. The first and the second conductive layers 31a and 31b are formed on the insulating layer 33. The third conductive layer 31c is formed on the lower surface of the chip 35. Herein, the first and the second conductive layers 31a and 31b are connected to the terminals A and B, respectively. The third conductive layers 31c is connected to the terminal (not shown) formed on the lower surface of the chip 35. The first, the second, and the third electrode surfaces 37a, 37b, and 37c are formed on the side surfaces of the first and the second conductive layers 31a and 31b formed on the upper surface of the chip 35 and on the side surface of the third conductive layer 31c formed on the lower surface of the chip 35, respectively. The side surfaces having the first, the second, and the third electrode surfaces 37a, 37b, and 37c are mounting surfaces on the printed circuit board. The chip scale package 30 is turned at an angle of 90 degrees, and the turned chip scale package 30 is then mounted on the printed circuit board so that the first, the second, and the third electrode surfaces 37a, 37b, and 37c are connected to the corresponding connection pads of the printed circuit board.

An oxidation layer may be formed on the exposed surfaces of the first, the second, and the third conductive layers 31a, 31b, and 31c by a natural oxidation. These oxidation layers serve as layers for protecting the first, the second, and the third conductive layers 31a, 31b, and 31c, thereby assuring the reliability of the first, the second, and the third conductive layers 31a, 31b, and 31c. However, in order to prevent the first, the second, and the third conductive layers 31a, 31b, and 31c from seriously oxidizing, a passivation layer 37 may be formed on the first, the second, and the third conductive layers 31a, 31b, and 31c except for the first, the second, and the third electrode surfaces 37a, 37b, and 37c. Preferably, the passivation layer 37 is an insulation film formed by coating insulating resin. If necessary, the passivation layer 37 may be formed on the exposed side surfaces of the chip 35.

Figure 4:
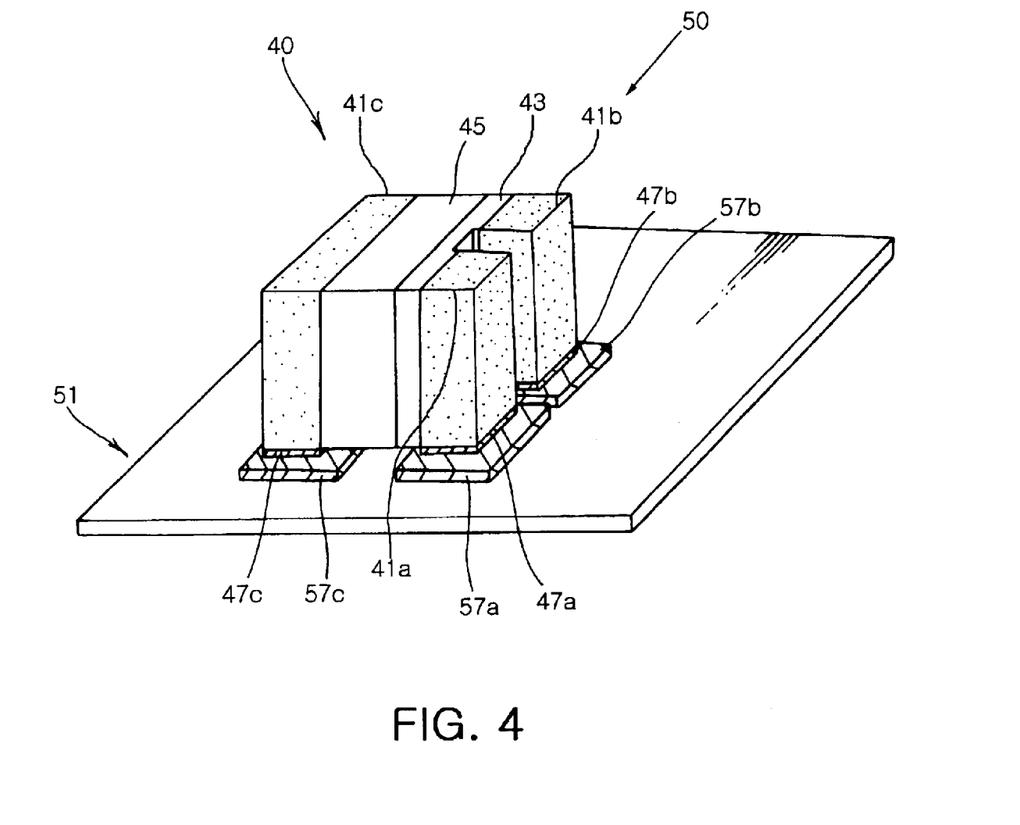
FIG. 4 is a perspective view of a chip scale package assembly, in which a chip scale package is mounted on a printed circuit board in accordance with the preferred embodiment of the present invention.

FIG. 4 is a perspective view of a chip package assembly 50, in which a chip scale package 40 is mounted on a printed circuit board 51 in accordance with the preferred embodiment of the present invention.

As shown in FIG. 4, the chip package assembly 50 comprises the chip scale package 40 and the printed circuit board 51 for mounting the chip scale package 40. As shown in FIGS. 3a and 3b, in the chip scale package 40, an insulating layer 43 is formed on the upper surface of a chip 45. A first and a second conductive layers 41a and 41b are formed on the upper surface of the insulating layer 43. The first and the second conductive layer 41a and 41b are connected to two terminals (not shown) formed on the upper surface of the chip 45, respectively. A third conductive layer 41c formed on the lower surface of the chip 45. The third conductive layer 41c is connected to a terminal (not shown) formed on the lower surface of the chip 45. A first, a second, and a third electrode surfaces 47a, 47b, and 47c are formed on designated side surfaces of the first, the second, and the third conductive layers 41a, 41b, and 41c. The first, the second, and the third electrode surfaces 47a, 47b, and 47c will be mounting surfaces of the chip scale package 40 on the printed circuit board 51. The first, the second, and the third electrode surfaces 47a, 47b, and 47c are connected to each corresponding terminal (not shown) of the chip 45 through the first, the second, and the third conductive layers 41a, 41b, and 41c, respectively. The chip scale package 40 is mounted on the printed circuit board 51 by disposing the first, the second, and the third electrode surfaces 47a, 47b, and 47c of the chip scale package 40 on corresponding connection pads 57a, 57b, and 57c of the printed circuit board 51 and by performing the soldering between the first, the second, and the third electrode surfaces 47a, 47b, and 47c and the connection pads 57a, 57b, and 57c, thereby completing the fabrication of the chip package assembly 50 of FIG. 4.

Designated circuits (not shown) formed on the printed circuit board 51 are connected to each terminal of the chip 45 via the first, the second, and the third electrode surfaces 47a, 47b, and 47c of the chip scale package 40 connected to the connection pads 57a, 57b, and 57c of the printed circuit board 51. Therefore, as described above, the first, the second, and the third conductive layers 41a, 41b, and 41c have a designated depth according to the interval between the connection pads 57a, 57b, and 57c of the printed circuit board 51.

Further, the present invention provides a method of fabricating the aforementioned chip scale package. FIGS. 5a through 5f are perspective views illustrating each step of the method of fabricating the chip scale package in accordance with a preferred embodiment of the present invention.

Figure 5A:
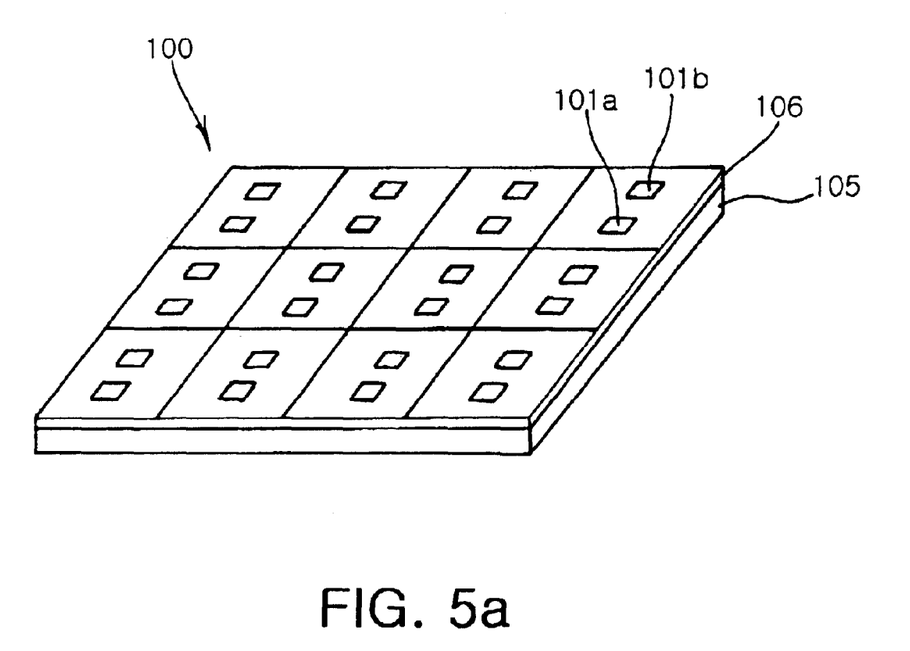
FIGS. 5a through 5f are perspective views illustrating each step of a method of fabricating the chip scale package in accordance with a preferred embodiment of the present invention.

First, as shown in FIG. 5a, a wafer 105 including a plurality of chips is prepared. Terminals are formed on the upper and the lower surface of each chip. Herein, each chip is divided by a dotted line of the upper surface of the wafer 105. FIG. 5a partially shows the wafer 105. However, the whole structure of the wafer 105 with a plurality of the chips will be apparent to those skilled in the art.

The chip comprises two terminals 101a and 101b on its upper surface and one terminal (not shown) on its lower surface, respectively. Further, a mask pattern 106 with a plurality of windows is formed on the upper surface of the wafer 105, thereby exposing the areas for the terminals 101a and 101b of the wafer 125. The windows of the mask pattern 106 correspond the areas for the terminals 101a and 101b of the wafer 125. The mask pattern 106 is made of an oxidation layer.

Figure 5B:
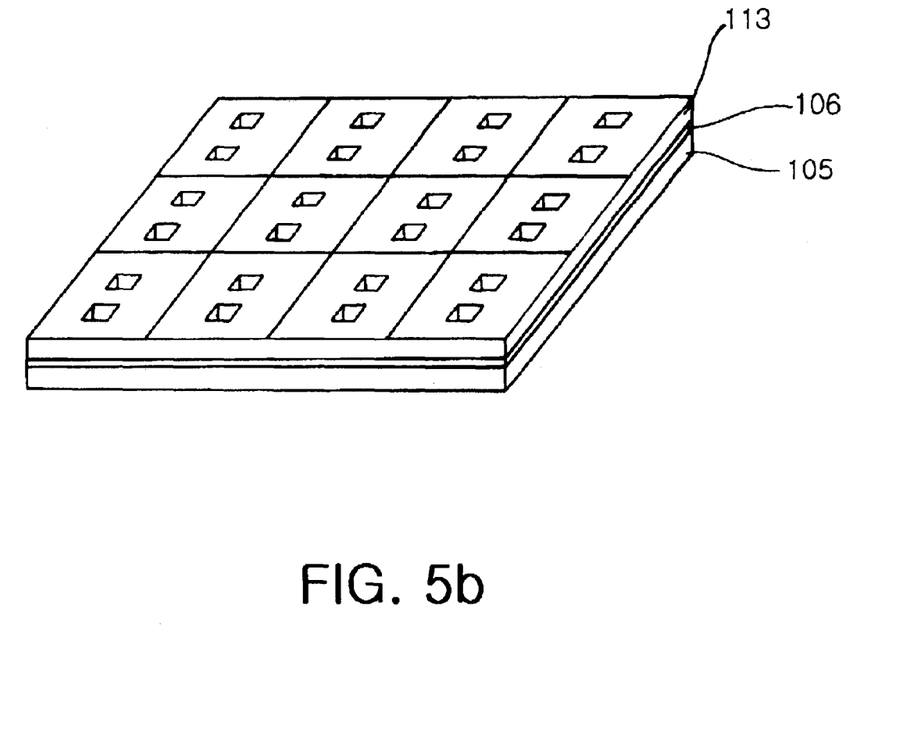
Figure 5C:
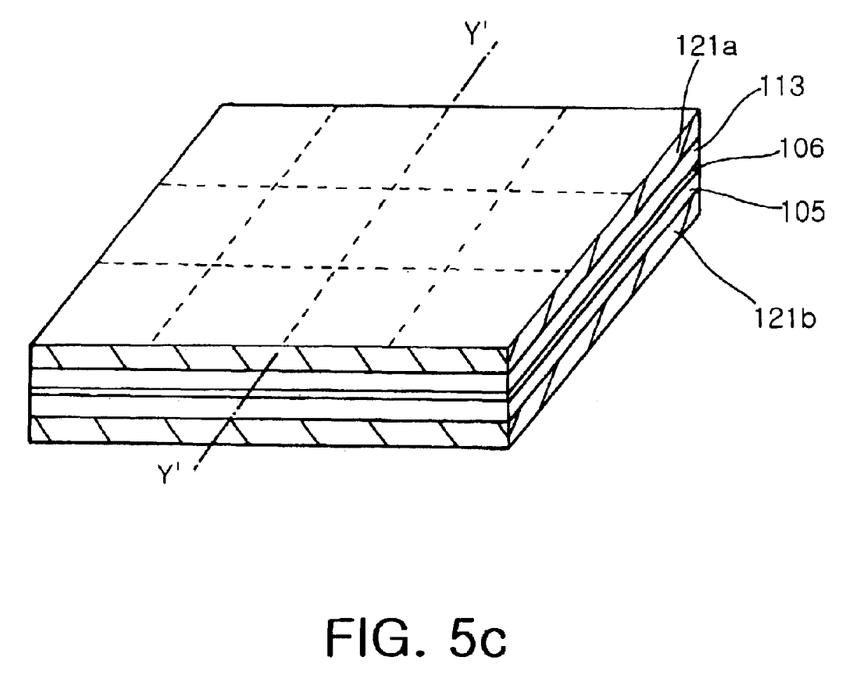

As shown in FIG. 5b, the insulating layer 113 is formed on the upper surface of the wafer 105. Then, as shown in FIG. 5c, an upper and a lower conductive layers 121a and 121b are formed on the upper surface of the insulating layer 113 and the lower surface of the wafer 105, respectively. Herein, the upper conductive layer 121a is formed on the upper surface of the insulating layer 113 so that the upper conductive layer 121a is connected to two terminals 101a and 101b of the wafer 105. Therefore, in order to form a metal layer to fill the windows for the terminals 101a and 101b, the upper conductive layer 121a is preferably formed by a plating method. However, as described above, the conductive layer has a predetermined thickness according to the interval between the connection pads so that the conductive layer has an enough sized side surface, on which the electrode surface is formed. Therefore, most preferably, the upper conductive layer is formed by forming a plating layer and then stacking at least one copper layer on the plating layer, thereby filling the windows corresponding the terminal 101a and 110b, on which the insulating layer is not formed. Then, the wafer 105 is first-diced into two rows of the chips along a line Y—Y' of FIG. 5c.

Figure 5D:
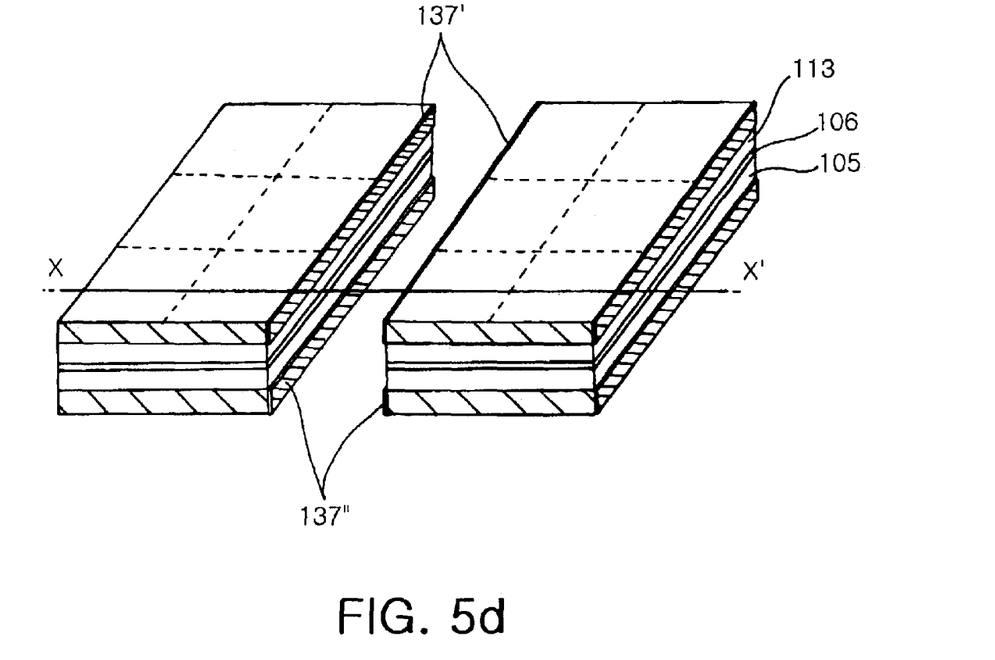

As shown in FIG. 5d, diced parts are obtained by first-dicing the wafer 105. Thereby, only one side surface of each chip scale package is formed. An upper and a lower electrode surfaces 137' and 137" are formed on the side surfaces of the upper and the lower conductive layers 121a and 121b of the side surface of the chip package obtained by first-dicing the wafer 105, respectively. The upper and the lower electrode surfaces 137' and 137" are selectively formed on the side surfaces of the upper and the lower conductive layers 121a and 121b by an electroplating. That is, the electrode surface is not formed on the side surface of the chip 35 made of silicon. However, the first and the second electrode surfaces 137' and 137" are formed on the side surfaces of the upper and the lower conductive layers 121a and 121b made of metal.

Figure 5E:
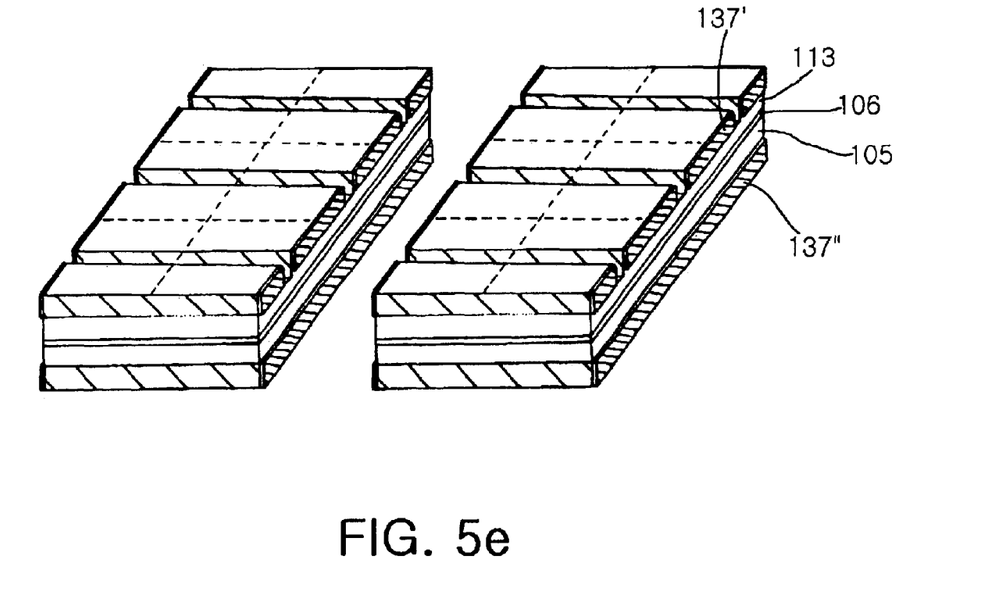

Parts of the upper conductive layer 121a are removed along a line of X—X' of FIG. 5d, thereby dividing the upper conductive layer 121a and the electrode layer 137' formed on the side surface of the upper conductive layer 121a into two parts connected to two terminals of the chip, as shown in FIG. 5e. Herein, the insulating layer 113 serves to prevent the chip from being damaged from the division of the upper conductive layer 121a.

Figure 5F:
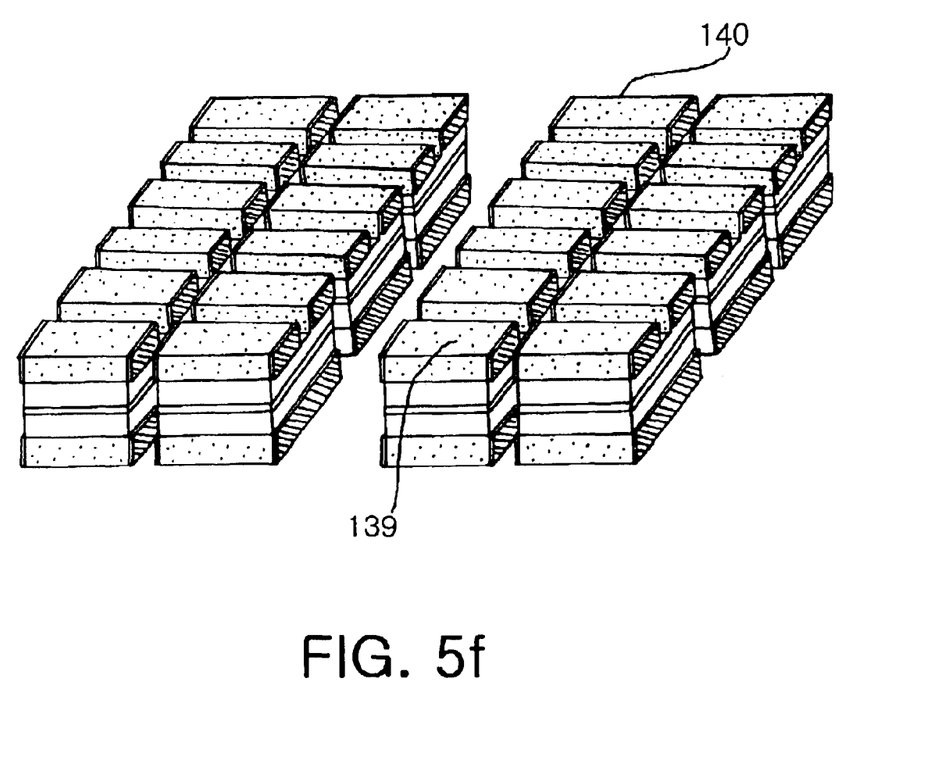

Then, in order to divide the first-diced wafer 105 into a plurality of package units, a second dicing step is performed, thereby completing the fabrication of a plurality of the chip scale packages 140. As shown in FIG. 5f, a passivation layer 139 may be further formed on the exposed surfaces of the upper and the lower conductive layers 121a and 121b of the chip scale package 140. The passivation layer 139 is made of an insulating film formed by coating insulating resin. The passivation layer 139 serves to prevent the upper and the lower conductive layers 121a and 121b from oxidizing, thereby improving the reliability of the chip scale package 140. If necessary, the passivation layer 139 may be omitted according to the working condition of the chip scale package 140.

The method of fabricating the chip scale package shown in FIGS. 5a through 5f is a preferred embodiment of the present invention. Therefore, the method of fabricating the chip scale package may be variously modified within the scope and spirit of the present invention. Particularly, the step of forming the passivation can be widely modified according to the dicing step.

For example, in the preferred embodiment of the present invention shown in FIGS. 5a through 5f, after the second-dicing step, the passivation layer is formed on the exposed surfaces of the conductive layers except for the electrode surfaces by coating the insulation resin once. However, the passivation layer may be formed by coating the insulation resin on the upper surfaces of the upper and the lower conductive layers after forming the upper and the lower conductive layers and by coating the insulation resin on the side surfaces of the upper and the lower conductive layers after the second-dicing step. Since the bottom surface of the wafer with the conductive layer is fixed to the tape or a vacuum apparatus, the former has a difficulty in forming the passivation layer on the conductive layers. However, the passivation layer of the latter is formed on the conductive layers prior to the dicing step, the latter solves this problem.

The step of dividing the upper conductive layer on the insulating layer into two parts as shown in FIG. 5e may be achieved simultaneously with the step of second-dicing the wafer as shown in FIG. 5f. That is, the step of dividing the upper conductive layer into two parts and the step of dicing the wafer into the package units may be simultaneously carried out by controlling a blade of the second-dicing step so that a cutting depth of the blade corresponds to the thickness of the conductive layer.

In accordance with the method of fabricating the chip scale package of the present invention, the wafer is diced into a plurality of chip scale packages having one chip, and the electrode surfaces are formed on the side surfaces of the upper and the lower conductive layers of one side surface of the chip scale package and the passivation layers are formed on other side surfaces of the conductive layers. Therefore, each dicing step for forming the side surfaces of the chip scale package and the steps for forming the passivation layers and the electrode surfaces may be variously modified in order and manner. These modifications or improvements are within the scope and sprit of the present invention.

As apparent from the above description, the present invention provides a chip scale package, which is miniaturized and more easily fabricated, by forming conductive layers on upper and lower surfaces of a chip, each having terminals and by forming electrode surfaces on the same sides surface of the conductive layers, thereby improving the reliability of the package. Further, the present invention provides a method for fabricating the chip scale package, in which the conventional wire bonding step or via hole forming step are omitted, thereby simplifying the fabrication process and reducing the fabrication cost.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a chip scale package, said method comprising the steps of:
   preparing a wafer including a plurality of chips, each of said chips including two upper terminals on an upper surface of the wafer and a lower terminal on a lower surface of the wafer;
   forming an insulating layer on the upper surface of the wafer except in areas of said upper terminals;
   forming an upper conductive layer on said insulating layer so as to be connected to each of said two upper terminals of each of said chips;
   forming a lower conductive layer on the lower surface of the wafer so as to be connected to the lower terminal of each of said chips;
   first dicing the wafer so that one side surface of the chip scale package is formed;
   forming electrode surfaces on side surfaces of the upper and the lower conductive layers, said side surfaces being defined by the side surface of the chip scale package obtained by said first dicing step;
   dividing the upper conductive layer of each of said chips into two areas each connected to one of said two upper terminals; and
   second dicing the wafer into package units.

2. The method as set forth in claim 1, further comprising the steps of:
   forming a passivation layer on each of the upper surface and the lower surface of the upper and the lower conductive layers, after the step of forming the upper conductive layer and the lower conductive layer; and
   forming a passivation layer on each of the side surfaces of the upper and the lower conductive layers except for the side surfaces having the electrode surfaces.

3. The method as set forth in claim 1, further comprising the step of forming passivation layers on the exposed surfaces of the first and the second conductive layers except for the side surfaces having the electrode surfaces, after the second dicing step.

4. The method as set forth in claim 2, wherein said passivation layers are made of insulating films formed by coating insulation resin.

5. The method as set forth in claim 1, wherein the first dicing step is performed so that scribe lines of the wafer are cut into two rows.

6. The method as set forth in claim 1, wherein the step of dividing the upper conductive layer is performed simultaneously with the second dicing step by controlling a cutting depth.

7. The method as set forth in claim 1, wherein the upper and the lower conductive layers are formed by a plating process.

8. The method as set forth in claim 1, wherein the conductive layers are metal layers including copper (Cu).

9. The method as set forth in claim 1, wherein the electrode surfaces are metal layers including gold (Au).

10. The method as set forth in claim 1, wherein each of the upper and the lower conductive layers is formed by forming a plating layer connected to the respective upper or lower terminals of the chips and by stacking at least one copper layer on the plating layer.

11. The method as set forth in claim 1, wherein the electrode surfaces are formed by a plating process.

12. The method of as set forth in claim 1, wherein each of said chips is a transistor.

* * * * *